US007663955B2

(12) United States Patent
Miller

(10) Patent No.: US 7,663,955 B2
(45) Date of Patent: Feb. 16, 2010

(54) DELAYED SENSE AMPLIFIER MULTIPLEXER ISOLATION

(75) Inventor: Christopher Miller, Underhill, VT (US)

(73) Assignee: Qimonda North America Corp., Cary, NC (US)

( * ) Notice: Subject to any disclaimer, the term of this patent is extended or adjusted under 35 U.S.C. 154(b) by 409 days.

(21) Appl. No.: 11/615,101

(22) Filed: Dec. 22, 2006

(65) Prior Publication Data

US 2008/0151663 A1 Jun. 26, 2008

(51) Int. Cl.
*G11C 7/02* (2006.01)
(52) U.S. Cl. .................... 365/207; 365/205; 365/210.1; 365/210.12
(58) Field of Classification Search ................. 365/207, 365/210.1, 210.12, 210.13, 205
See application file for complete search history.

(56) References Cited

U.S. PATENT DOCUMENTS

| | | | | |
|---|---|---|---|---|
| 5,673,231 A | * | 9/1997 | Furutani | ..................... 365/203 |
| 6,016,279 A | * | 1/2000 | Chi | ............................ 365/203 |
| 6,018,481 A | * | 1/2000 | Shiratake | ..................... 365/190 |
| 6,850,454 B2 | * | 2/2005 | Kuge et al. | .................. 365/227 |
| 7,102,935 B2 | * | 9/2006 | Miki et al. | ............. 365/189.09 |
| 7,227,799 B2 | * | 6/2007 | Vogelsang | .................. 365/205 |
| 7,403,439 B2 | * | 7/2008 | Miller et al. | ................. 365/203 |
| 2007/0153601 A1 | * | 7/2007 | Savignac et al. | ............ 365/207 |
| 2007/0223302 A1 | * | 9/2007 | Sturm et al. | ........... 365/230.03 |
| 2007/0247938 A1 | * | 10/2007 | Miller et al. | ................. 365/207 |
| 2008/0074939 A1 | * | 3/2008 | Mori | .......................... 365/203 |
| 2008/0151647 A1 | * | 6/2008 | Miller et al. | ........... 365/189.02 |

* cited by examiner

*Primary Examiner*—Tuan T Nguyen
*Assistant Examiner*—Hien N Nguyen
(74) *Attorney, Agent, or Firm*—Edell, Shapiro & Finnan, LLC

(57) ABSTRACT

Methods and circuit arrangements are provided for improving equalization of sense nodes of a sense amplifier in a semiconductor memory device. When a memory array segment on a side a sense amplifier has a bitline leakage anomaly for which the sense amplifier is to be isolated when that memory is in an unselected state, isolation of the sense amplifier from the memory array segment is delayed when transitioning from a selected state of the memory array segment to an unselected state of the memory array segment. The duration of the delay is sufficient to allow time for equalization of the sense nodes of the sense amplifier before isolating the sense amplifier from the memory array segment.

15 Claims, 10 Drawing Sheets

DELAYED SENSE AMPLIFIER MULTIPLEXER ISOLATION

BACKGROUND OF THE INVENTION

The present invention relates to semiconductor memory devices.

In a semiconductor memory device, such as a dynamic random access memory (DRAM) device, a sense amplifier is provided to sense a small potential difference between a reference voltage and voltage on an active bitline connected to a memory storage cell in a memory array. The sense amplifier amplifies the small difference from which a binary state is determined for the memory storage cell.

In a typical DRAM, the sense amplifier is shared by first and second memory array segments to sense voltage on bitlines to either one memory array segment or the other memory array segment, but never sensing from both memory array segments at the same time. To this end, a first multiplexer is provided that connects a sense node pair of the sense amplifier to, and disconnects the sense node pair from, the first memory array segment. A second multiplexer is provided that connects the sense node pair of the sense amplifier to, and disconnects the sense node pair from, the second memory array segment. Control logic is provided in the memory device to generate multiplexer control signals that control the state of the first and second multiplexers depending on the state of selection signals. The selection signals are derived from control and address signals in order to select the appropriate memory array segments for access.

When a memory array segment associated with a sense amplifier is unselected, the sense amplifier is allowed to stay connected to the memory array segment in order to undergo a so-called precharging sequence that allows the bitline pair connected to the memory array segment (and to the sense amplifier via the multiplexer) to precharge and equalize the voltage on sense nodes of the sense amplifier. This precharging sequence brings the sense nodes of the sense amplifier to a sufficient and equalized voltage so that it is ready for an access to a memory array segment at the next selection cycle. The term "equalization" used in the art to refer to bringing a bitlines in a bitline pair and/or sense nodes in a sense node pair of a sense amplifier to a desired and equal voltage.

A technique has been developed to reduce leakage current associated with a wordline to bitline short-circuit condition in a memory array cell by disconnecting the sense amplifier sense nodes from that memory array segment during periods when it is unselected in order to isolate the sense amplifier from the memory array segment containing the short-circuit condition. A consequence of this isolation technique is that the effectiveness of the precharging sequence is reduced because the sense amplifier is immediately disconnected from the memory array segment that has the short circuit condition when the memory array segment state is transitioning from a selected state to an unselected state. Therefore, the sense amplifier sense nodes are not given sufficient time to be precharged and equalized by the bitline pair associated with that memory array segment. Consequently, the sense node equalization is slower and exhibits a DC offset.

Thus, a technique is needed to improve sense amplifier sense node equalization during transitions from a selected state of a memory array segment to an unselected state when the sense amplifier is to be isolated from the memory array segment.

SUMMARY OF THE INVENTION

Briefly, methods and circuit arrangements are provided for improving equalization of sense nodes of a sense amplifier in a semiconductor memory device when isolating the sense amplifier from a memory array segment due to a bitline leakage anomaly in the memory array segment. Isolation of the sense amplifier from the memory array segment is delayed when transitioning from a selected state of the memory array segment to an unselected state of the memory array segment. The duration of the delay is sufficient to allow time for equalization of the sense nodes of the sense amplifier before isolating the sense amplifier from the memory array segment.

According to one embodiment, a circuit configuration for a sense amplifier in semiconductor memory device is provided. The circuit configuration comprises a switch circuit and a control circuit. The switch circuit is connected between the sense amplifier and a memory array segment, and connects and disconnects the sense amplifier to and from the memory array segment. The control circuit controls the switch circuit to delay disconnection of the sense amplifier from the memory array segment (due to a bitline leakage anomaly in the memory array segment) when transitioning from a selected state of the memory array segment to an unselected state of the memory array segment to allow time for equalization of the sense nodes of the sense amplifier before disconnecting the sense amplifier from the memory array segment.

DETAILED DESCRIPTION

Figure 1:
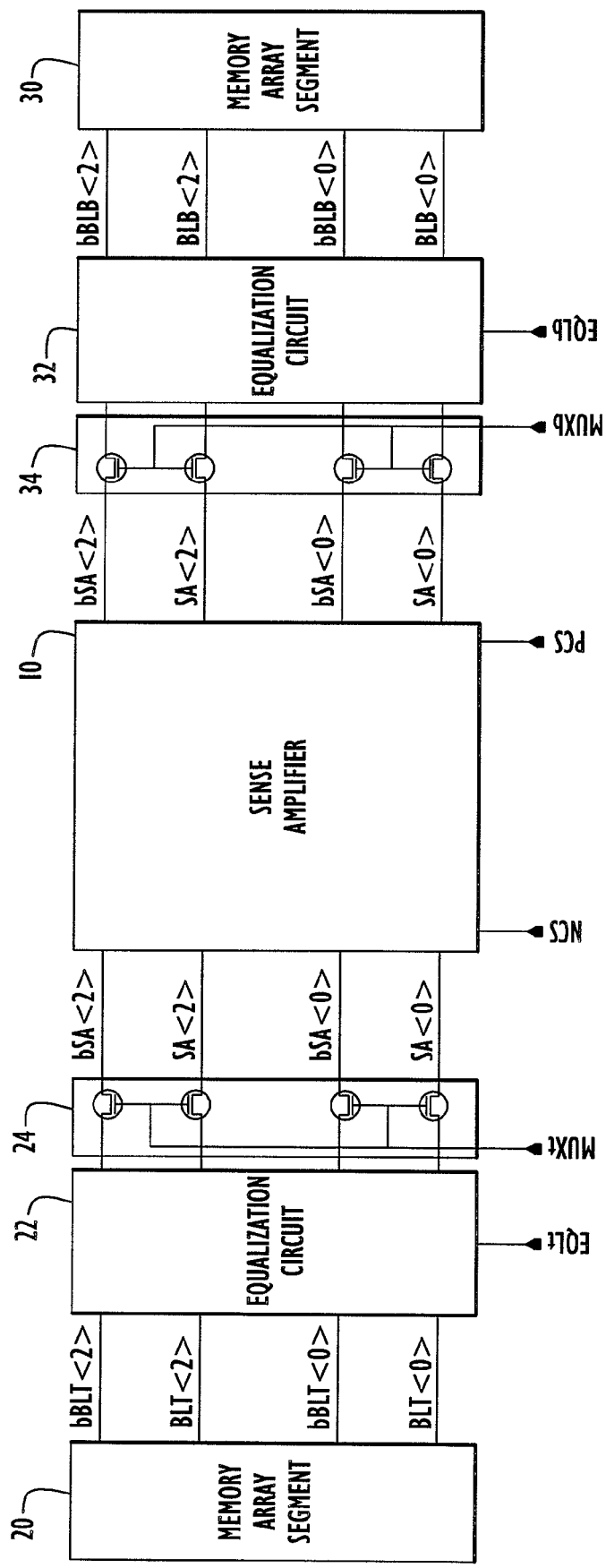
FIG. 1 is a block diagram of a conventional sense amplifier configuration used in a semiconductor memory device.

FIG. 1 illustrates a sense amplifier circuit arrangement used in a state-of-the art dynamic random access memory (DRAM) device. A sense amplifier 10 has complementary sense node pairs bSA<2>,SA<2>and bSA<0>,SA<0>that are used to sense and amplifier a bitline potential difference in a memory array segment 20 on a first side ("t" side) or in a memory array segment 30 on a second side ("b" side). On the "t" side of the sense amplifier 10 there is an equalization circuit 22 that connects to the complementary bitline (BL) pairs bBLT<2>,BLT<2>and bBLT<0>,BLT<0>associated with a first memory array segment 20, and a multiplexer circuit 24. In response to an equalization control signal EQLt, the equalization circuit 22 precharges and equalizes voltage on the BL pairs that are associated with the memory array segment 20. Based on the state of a multiplexer control signal MUXt, the multiplexer circuit 24 controls whether the sense amplifier 10 is connected to or disconnected from the BL pairs associated with the memory array segment 20 on the "t" side. Similarly, on the "b" side of the sense amplifier 10 there is an equalization circuit 32 that connects to the complementary BL pairs bBLB<2>,BLB<2>and bBLB<0>,BLB<0>, and a multiplexer circuit 34. In response to an equalization control signal EQLb, the equalization circuit 32 precharges and equalizes voltage on the BL pairs associated a second memory array segment 30. Based on the state of a multiplexer control signal MUXb, the multiplexer circuit 34 controls whether the sense amplifier is connected to or disconnected from the BL pairs associated with the memory array segment 30. It should be understood that in a typical DRAM device, there is a column of sense amplifiers 10 arranged between columns of memory array segments on opposite sides thereof. The multiplexer circuits 24 and 34 may be more generally referred to herein as switch circuits. The multiplexer circuit 24, in one state, connects the sense amplifier 10 to the memory array segment 20 on the "t" side, and in another state disconnects the sense amplifier 10 from the memory array segment 20. Similarly, the multiplexer circuit 34, in one state, connects the sense amplifier 10 to the memory array segment 30 on the "b" side and in another state disconnects the sense amplifier 10 from the memory array segment 30.

A memory array segment is in a so-called "selected" state is when it is necessary to connect to the sense amplifier for a read, write or self-refresh operation. When a sense amplifier is connected to a memory array segment, the sense nodes of the sense amplifier can be equalized from the BLs to which they are connected. An "unselected" state of a memory array segment is when it is not necessary to connect the sense amplifier to the memory array segment for a read, write or self-refresh operation.

Figure 2:
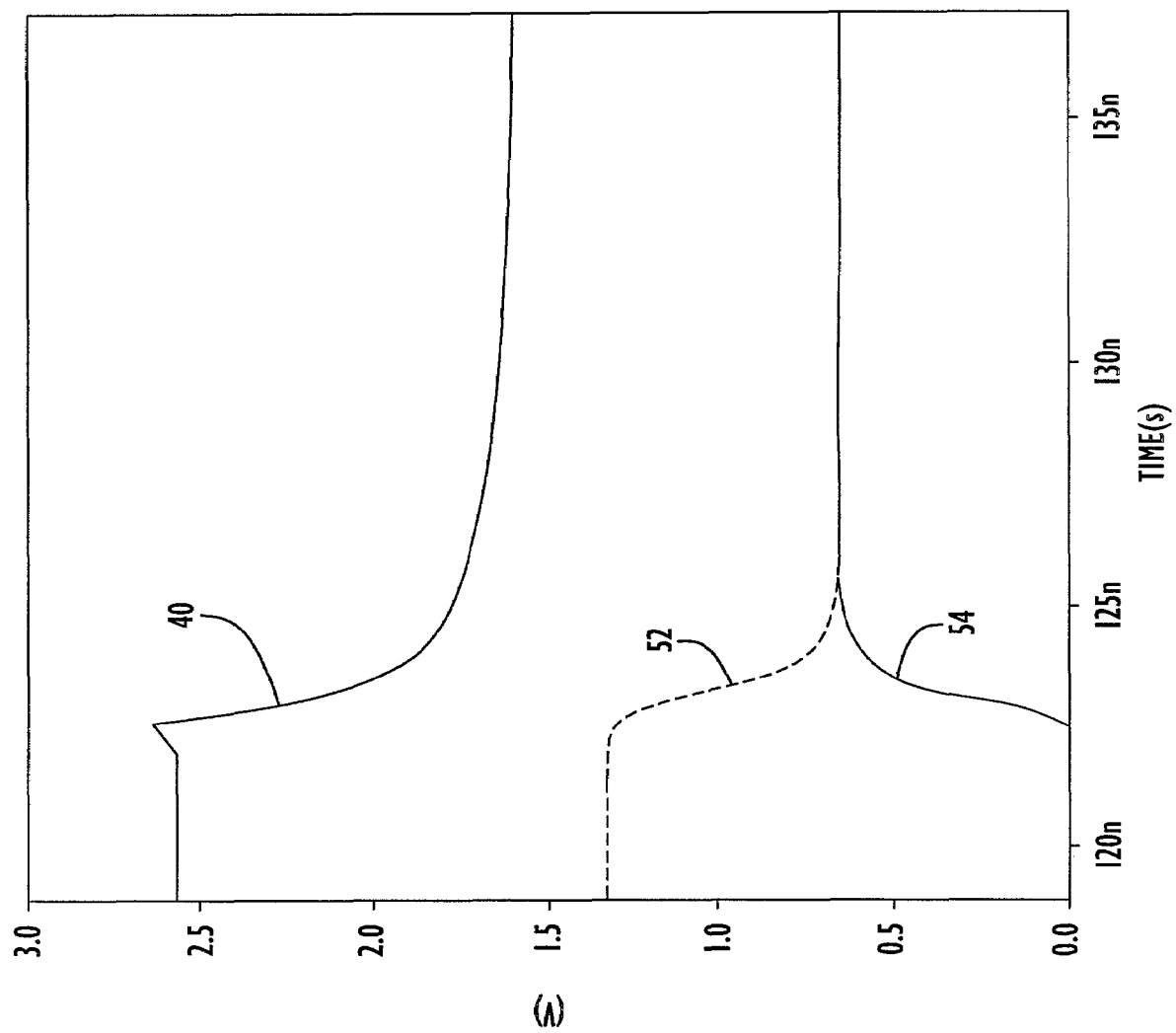
FIG. 2 is a graph showing plots of signals related to sense amplifier node equalization during a transition from a selected state to a non-selected state of a memory array segment in the sense amplifier configuration shown in FIG. 1.

Turning to FIG. 2, plots are shown for certain signals to illustrate equalization of the sense nodes of the sense amplifier 10 during a transition from a selected state to a unselected state for one of the memory array segments associated with the sense amplifier. The signal shown at reference numeral 40 is the voltage of multiplexer control signal MUXt or MUXb for one of the multiplexer circuits 24 or 34, respectively, that is associated with the memory array segment in a selected state and transitioning to an unselected state. The signal 40 decreases from a maximum value to a minimum value in a somewhat gradual manner allowing the voltage of the sense nodes of the sense amplifier sufficient time to equalize. The signal plots shown at 50 and 52 are a complementary pair of sense node voltages. In fact, in this mode of operation, equalization of the sense nodes mirrors the equalization on the BLs of the previously selected memory array segment.

Figure 3:
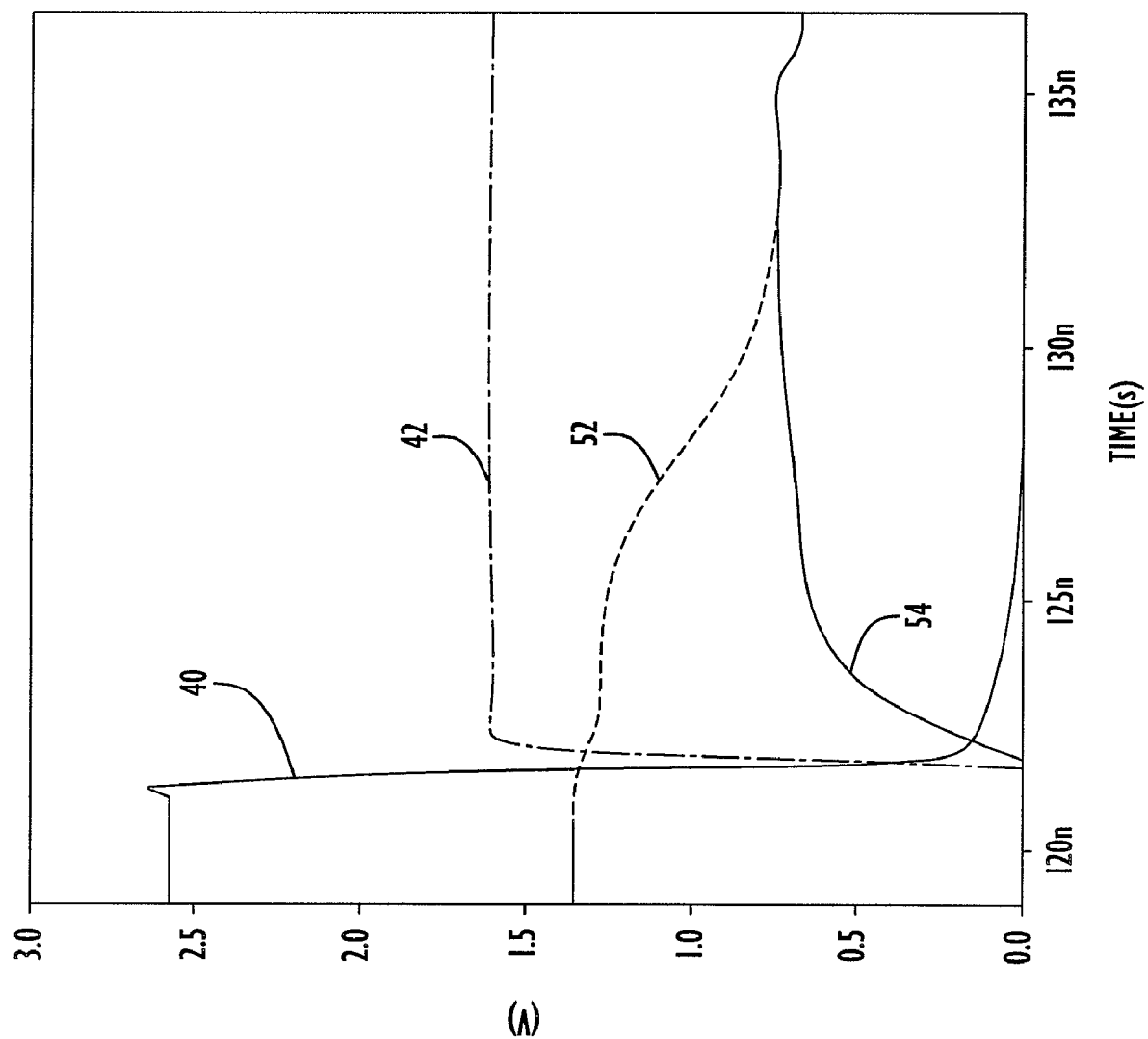
FIG. 3 is a graph showing plots of signals related to sense amplifier node equalization during a transition from a selected state to a non-selected state where the sense amplifier is isolated from the memory array segment on one side.

FIG. 3 shows plots for those sense amplifier signals when the sense amplifier is isolated from a memory array segment during a transition from a selected state of the memory array segment to an unselected state. Isolating sense nodes of a sense amplifier during periods of array unselection reduces array related leakage current resulting from an anomalous bitline leakage condition that may be due to low resistive path defects (e.g., short-circuits), excessive junction leakage, or other causes. In this mode of operation, the signal 40 rapidly goes from its maximum value to its minimum value in order to cause the multiplexer to isolate that side of the sense amplifier from the memory array segment. As a result, the signal 40 does not remain at higher voltage long enough (prior to sense amplifier isolation) to allow the devices in the multiplexer (on the side of the sense amplifier to be isolated) to equalize the sense nodes of the sense amplifier. Instead, equalization of the sense nodes occurs through multiplexer devices that are connected to the signal 42 that goes from 0V to only 1.6V, nearly 1V below the signal 40. This impairs the ability for the BLs on the previously selected side of the sense amplifier to assist in equalizing the sense amplifier nodes. Thus, the current multiplexer isolation control techniques exhibit the undesired side-effect of reducing the effectiveness of sense amplifier node equalization when the multiplexer circuit is reset (turned-off) during a transition from a selected state to an unselected state of a memory array segment. This is evident in FIG. 3 where the signals 50 and 52 converge more slowly than they do in the case of FIG. 2 and the equalization of these signals exhibits a DC offset when transitioning to an isolation state. Moreover, effective sense amplifier node equalization current is reduced when unselecting an isolated memory array segment at the start of a precharge sequence.

Figure 4:
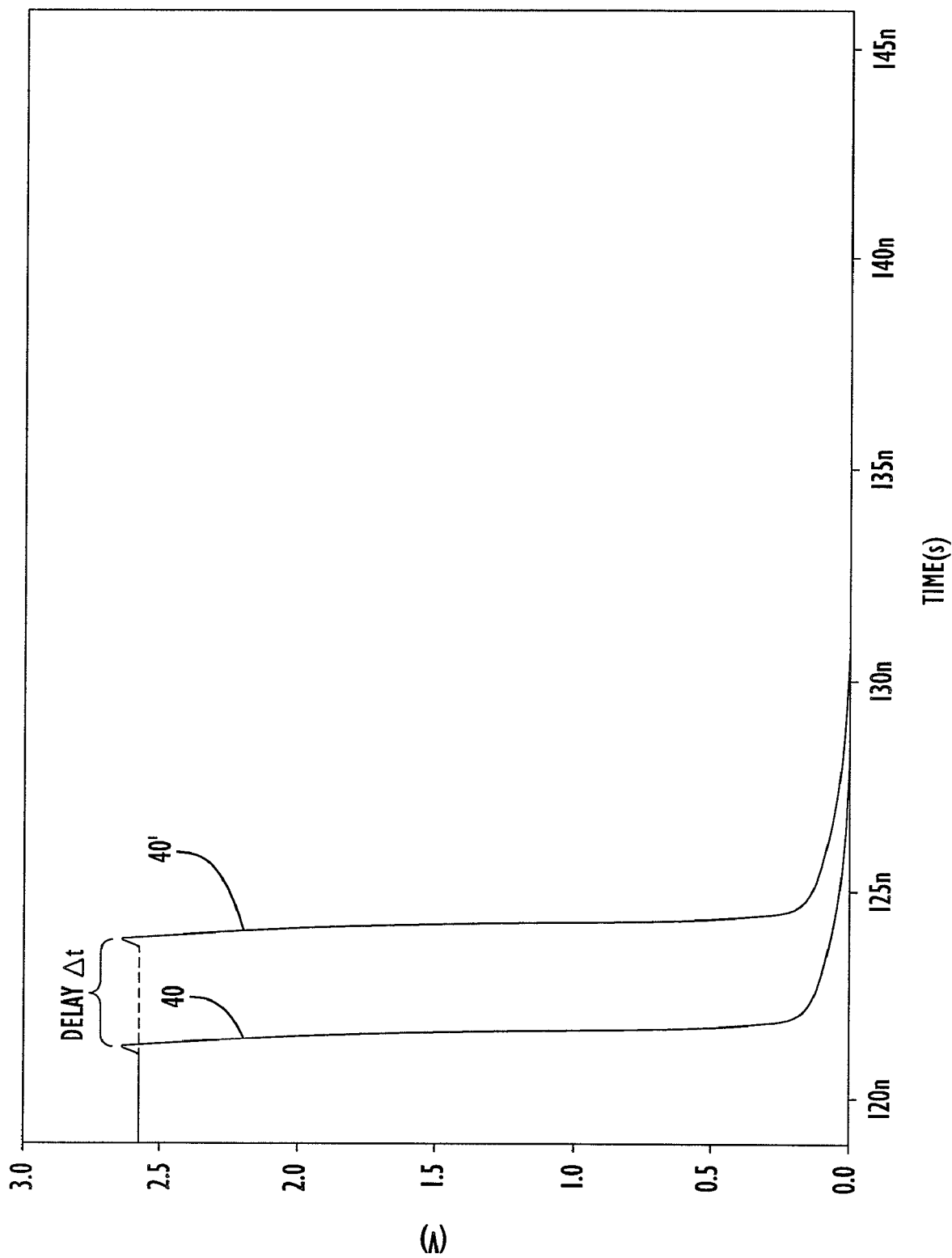
FIG. 4 is a graph showing plots of signals related to sense amplifier node equalization when transitioning to an isolating state similar to those shown in FIG. 3, but showing one embodiment of the invention.

An embodiment of the present invention is described with reference first to FIG. 4. According to one embodiment, when transitioning from a selected state to an unselected state of a memory array segment on one side of the sense amplifier, isolation of the sense amplifier (from the memory array segment on that side of the sense amplifier due to an anomalous bitline leakage condition in that memory array segment) is delayed by a period of time Δt sufficient to allow for the sense nodes of the sense amplifier to equalize. This is shown in FIG. 4, where the transition from a maximum value to a minimum value of signal 40' is delayed in time from where it would normally have occurred when isolating the sense amplifier from a memory array segment. The duration of this time delay allows time for the sense amplifier nodes to equalize, and at expiration of this delay time period, the multiplexer is switched to the disconnected state thereby isolating the sense amplifier from the previously selected memory array segment. It should be understood that while FIG. 4 illustrates the delayed transition of the signal 40' to be a rapid one from its maximum level to its minimal level, it is not always necessary and desirable that it be rapid. For example, that it may be desirable in certain cases to more gradually transition signal 40' to reduce or eliminate issues associated with noise that can be generated in the sense amplifier related circuitry when there is a rapid signal transition.

As indicated above, the duration of the delay period of time, Δt, is adjustable. In one embodiment, the period of time is made long enough to achieve complete equalization of the sense nodes of the sense amplifier. Generally, equalization of the sense nodes in a DRAM device requires a time interval on the order of several to tens of nanoseconds, whereas the period of time during which the sense amplifier is isolated from a memory array segment is typically on the order of several to tens of microseconds. Therefore, it is possible to delay going into isolation long enough to achieve complete equalization of the sense nodes of the sense amplifier. Conversely, the delay period of time Δt may be made short enough so that the isolation interval still serves the desired purpose of effectively eliminating leakage current from the memory array segment having a bitline leakage anomaly. A BL leakage anomaly is an array related leakage current that may be due to low resistive path defects (e.g., short-circuits), excessive junction leakage, or other causes.

Figure 5:
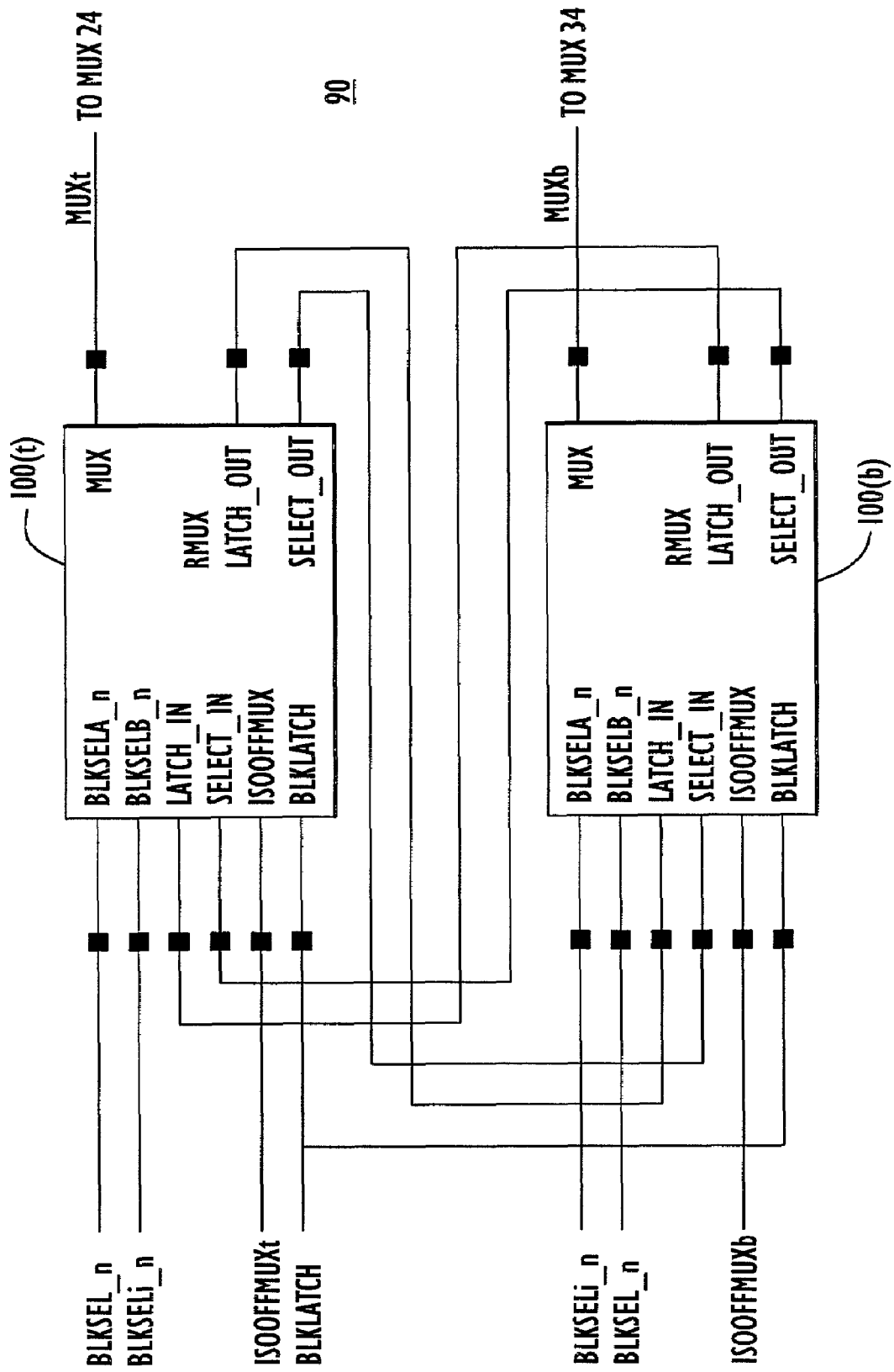
FIG. 5 is a block diagram of a multiplexer control logic according to one embodiment of the invention.

FIG. 5 illustrates multiplexer control logic 90 comprising a complementary pair of multiplexer control circuits 100(t) and 100(b) that generate multiplexer control signals MUXt and MUXb for the "t" and "b" sides of the sense amplifier, respectively. The control circuits 100(t) and 100(b) are structurally identical. The inputs to both control circuits 100(t) and 100(b) are blksela_n, blkselb_, latch_in, select_in, isooffmux and blklatch. However, the input signals to these inputs are not the same for the control circuits 100(t) and 100(b). The input signals to the multiplexer control circuit 100(t) are the memory array block select signals blksel_n, blkseli_n, the memory array block latch signal blklatch and the "t" side isolation control signal isooffmuxt. The input signals to the multiplexer control circuit 100(b) are the memory array block signals blkseli_n, blksel_n, the memory array block latch signal blklatch and the "b" side isolation control signal isooffmuxb. The outputs of each control circuit 100(t) and 100(b) are MUX, rmux latch_out and select_out. The multiplexer control circuit 100(t) generates the "t" side multiplexer control signal MUXt at its mux_n output and the multiplexer control circuit 100(b) generates the "b" side multiplexer control signal MUXb at its mux_n output. The rmux latch out output of the control circuit 100(t) is tied to the latch_in input of control circuit 100(b). The select_out output of control circuit 100(t) is tied to the select in input of control circuit 100(b). Conversely, the rmux latch_out output of control circuit 100(b) is tied to the latch_in input of control circuit 100(t). Similarly, the select_out output of the control circuit 100(b) is tied to the select_in input of the control circuit 100(t).

Figure 6:
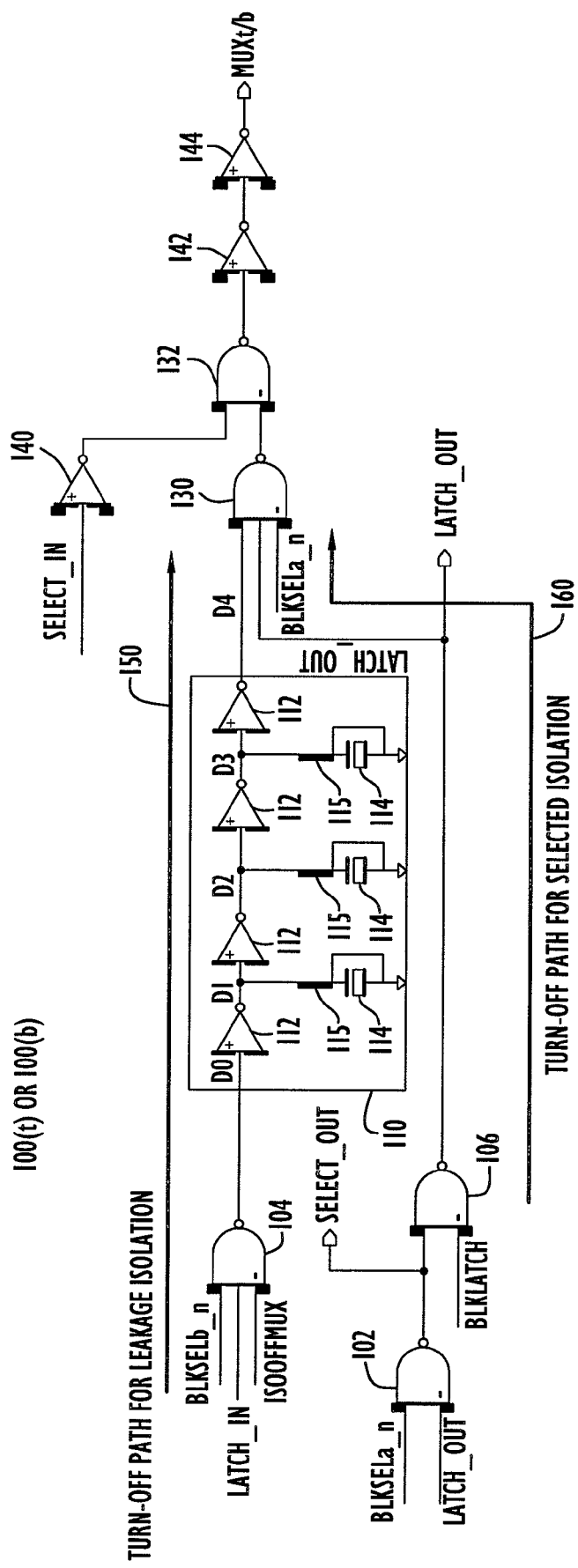
FIG. 6 is a schematic diagram of a multiplexer control circuit forming a portion of the control logic shown in FIG. 5, according to one embodiment of the invention.

Turning to FIG. 6, an embodiment of one of the multiplexer control circuits is shown. It should be understood that this control circuit may be used to produce either of the multiplexer control signals MUXt or MUXb. FIG. 6 shows that the multiplexer control circuit has two circuit paths for generating an output state of the multiplexer control signal that causes the multiplexer to switch to the disconnected state, such as a turn-off state. When the multiplexer is switched to this particular state (e.g., turn-off state), the multiplexer completely disconnects and thereby isolates the sense amplifier from the memory array segment on that side of the sense amplifier. Thus, for simplicity, these circuit paths are referred to as first and second turn-off circuit paths.

The multiplexer control circuit 100(t) (and 100(b)) comprises NAND gates 102, 104, 106 that receive the input signals, an adjustable delay circuit 110, NAND gates 130 and 132, and inverters 140, 142 and 144. The first turn-off circuit path is shown at reference numeral 150 and the second turn-off circuit path is shown at reference numeral 160. The adjustable delay circuit 110 resides in the first turn-off circuit path.

The input signals of the NAND gate 102 are the block select signal blksel_n which is coupled to the blksela_n input and the latch signal at the latch_out output of this multiplexer control circuit. The inputs of the NAND gate 104 are the block select signal blkseli_n, the latch signal from the output latch_out of the other multiplexer control circuit, and the isolation control signal. For example control circuit 100(t) generates the "t" side multiplexer control signal MUXt. Therefore, the isolation control signal to NAND gate 104 for control circuit 100(t) is isooffmuxt and the latch signal supplied to the latch_in input is the latch signal produced at the latch_out output of the multiplexer control circuit 100(b). The input to NAND gate 106 is the blklatch signal. Conversely, for control circuit 100(b), the isolation control signal to NAND gate 104 is isooffmuxb and the latch signal supplied to the latch_input is the lat signal produced at the latch_out output of the control circuit 100(t).

The adjustable delay circuit 110 is connected to the output of NAND gate 104 and comprises a chain of delay elements 112. For example, in one embodiment, the delay elements 112 are inverters. There is a capacitor 114 between consecutive ones of the delay elements 112. A programmable connection element 115 is provided in series with each capacitor 114 between the capacitor and the output of the corresponding inverter 112. The overall amount of delay introduced by the circuit 110 is adjusted by selecting which one or more of the capacitors 114 are connected to the inverter outputs. A programmable connection element may comprise a metal pattern made on the semiconductor integrated circuit during the manufacturing process or by other means. For example, the programmable connection can also be made with a multiplexer device connected between each capacitor and the corresponding inverter output. The multiplexer would be controlled by at least one signal generated by the state of a fuse or other programmable structure in the control logic portion of a the semiconductor memory device and applied to one or more of the multiplexer devices that form the connection(s) of the associated capacitor 114 to the corresponding inverter output. Thus, the delay circuit 110 introduces a time delay to the output of the NAND gate 104 by an adjustable amount to ensure sufficient equalization of the sense nodes of the sense amplifier. The output of the delay circuit 110 is connected to one input of the NAND gate 130. The other inputs to the NAND gate 130 are the output of the NAND gate 106, also called the latch signal referred to above in connection with the description of NAND gate 102, and the block select signal blksel_n supplied to the blksela_n input. The output of the NAND gate 130 is connected to one input of the NAND gate 132. The inverter 140 receives as input the output signal produced at the select out of the other multiplexer control circuit. The output of the inverter 140 is connected to the other input of the NAND gate 132. The output of the NAND gate 132 is connected to an input of the inverter 142, the output of which is in turn connected to input of inverter 144. The output of inverter 144 is the multiplexer control signal, either MUXt or MUXb depending on whether it is control circuit 100(t) or control circuit 100(b). The digital logic in the control circuit shown in FIG. 6 operates to change the state of a multiplexer control signal MUXt/MUXb either through the first circuit path 150 or the second circuit path 160 depending on the current state (selected or unselected) of the memory array segment on the respective side of the sense amplifier and whether the sense amplifier is to be isolated from memory array segments on either or both sides to reduce current leakage caused by a BL-WL leakage anomaly.

Figure 7:
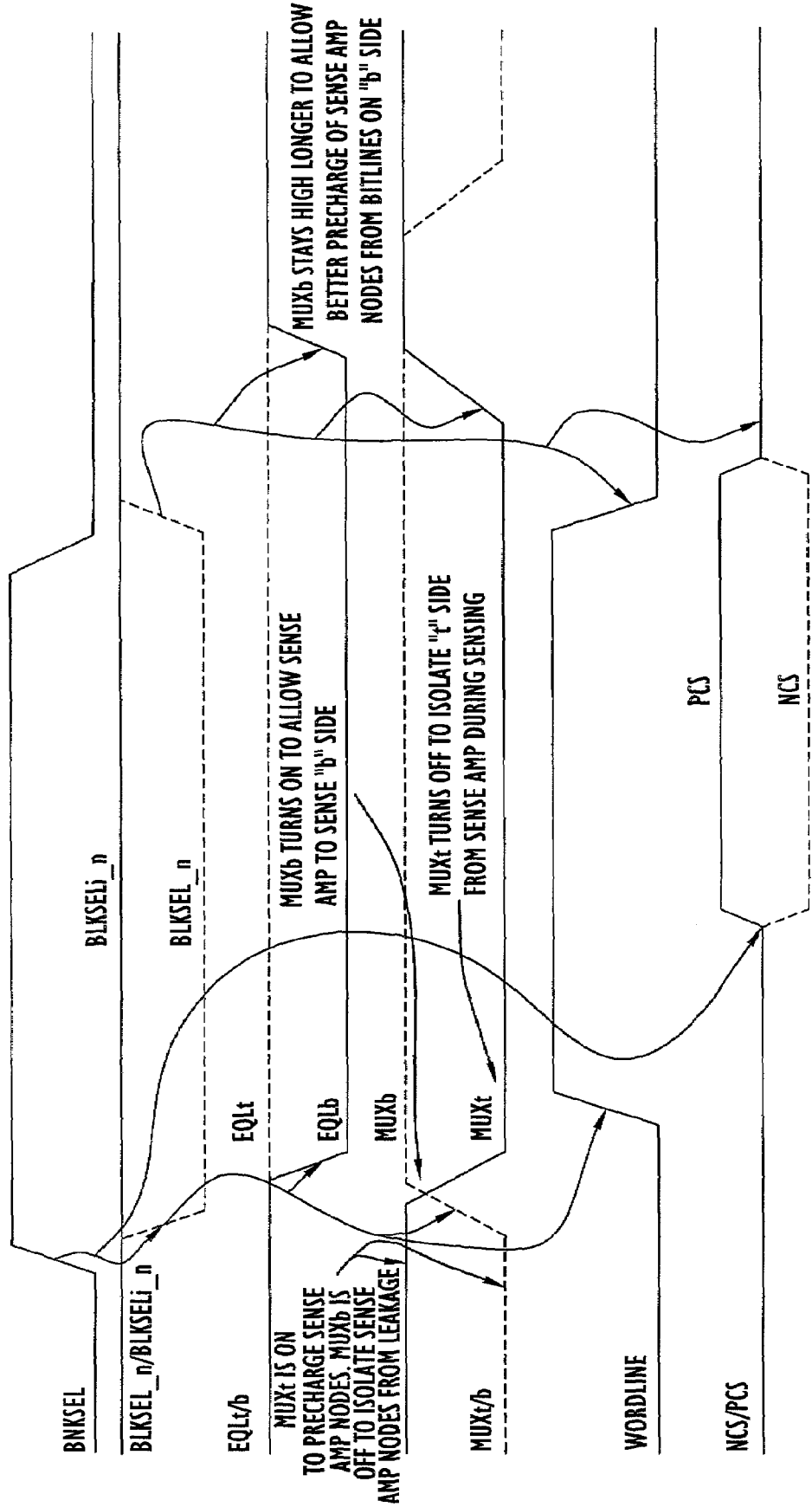
FIG. 7 is a timing diagram showing operation of a sense amplifier circuit configuration employing the multiplexer control circuit shown in FIG. 6 according to one embodiment of the invention.

Reference is now made to FIG. 7, with continued reference to FIG. 6, for a description of the operation of a multiplexer control circuit according to an embodiment of the invention. The BNKSEL signal goes high when a bank of memory array segments is selected based on a decoded memory address. Next, within the selected bank, block (n) of memory array segments is selected when the block selected signals blksel_n and blkseII_n transition as shown in FIG. 7. Before accessing the selected block, the memory array segment on the "t" side of the sense amplifier is in a precharge state whereas the memory array segment on the "b" side of the sense amplifier is also in a precharge state but is also in an isolated state to isolate the sense amplifier sense nodes from any leakage current that is present, due to a BL-WL anomaly, in that memory array segment. Thus, the MUXt signal is high and the MUXb signal is low at this point in the cycle. When the memory array segment on the "b" side is selected, the equalization control signal EQLb goes low (turns off) and the MUXb signal goes high to turn on the multiplexer on the "b" side of the sense amplifier in order to allow the sense amplifier to sense the bitline voltage resulting from array cell charge exchange between array cell and bitline in the memory array segment on the "b" side. In addition, the MUXt signal goes low to turn off the multiplexer on the "t" side in order to isolate the memory array segment and bitlines on the "t" side from the sense amplifier. For this transition to the off state for the multiplexer on the "t" side, the digital logic in the multiplexer control circuit will activate the second turn-off circuit path which causes the MUXt signal to nearly immediately go low thereby turning off the multiplexer on the "t" side. After the MUXt/b and EQLt/b signals have transitioned for accessing a selected memory array segment it is then safe to activate the wordline to allow charge to be shared between the selected array cell and the bitline. Some time interval after the wordline is activated and sufficient charge sharing has occurred, the NCS and PCS sense amplifier control signals transition to turn on the sense amplifier.

At the start of the precharge period the MUXt signal goes high again after the wordline and sense amplifier are turned off to precharge the sense amplifier sense nodes on the "t" side. On the "b" side, the digital logic in the multiplexer control circuit uses the first turn-off circuit path so that the MUXb signal stays high for a period of time corresponding to the delay of the adjustable delay circuit 110 in control circuit 100(b) to keep the sense amplifier connected to the BLs on the "b" side long enough to equalize the sense amplifier sense nodes. Using the first turn-off circuit path, the MUXb signal goes low (after the time interval corresponding to the delay of the delay circuit 110 expires) thereby isolating the sense amplifier from the "b" side at the end of the transition to the unselected state for the "b" side memory array segment.

In the embodiment shown in FIG. 6, the time delay is produced within the multiplexer control circuit itself. It may be desirable for certain designs to use a delay control signal that is supplied to the multiplexer control circuit from another circuit on the semiconductor integrated circuit. For example, and not by way of limitation, the delay signal may be a so-called global signal that is broadcasted for a circuit on the chip to some or all of the multiplexer control circuits.

Figure 8:
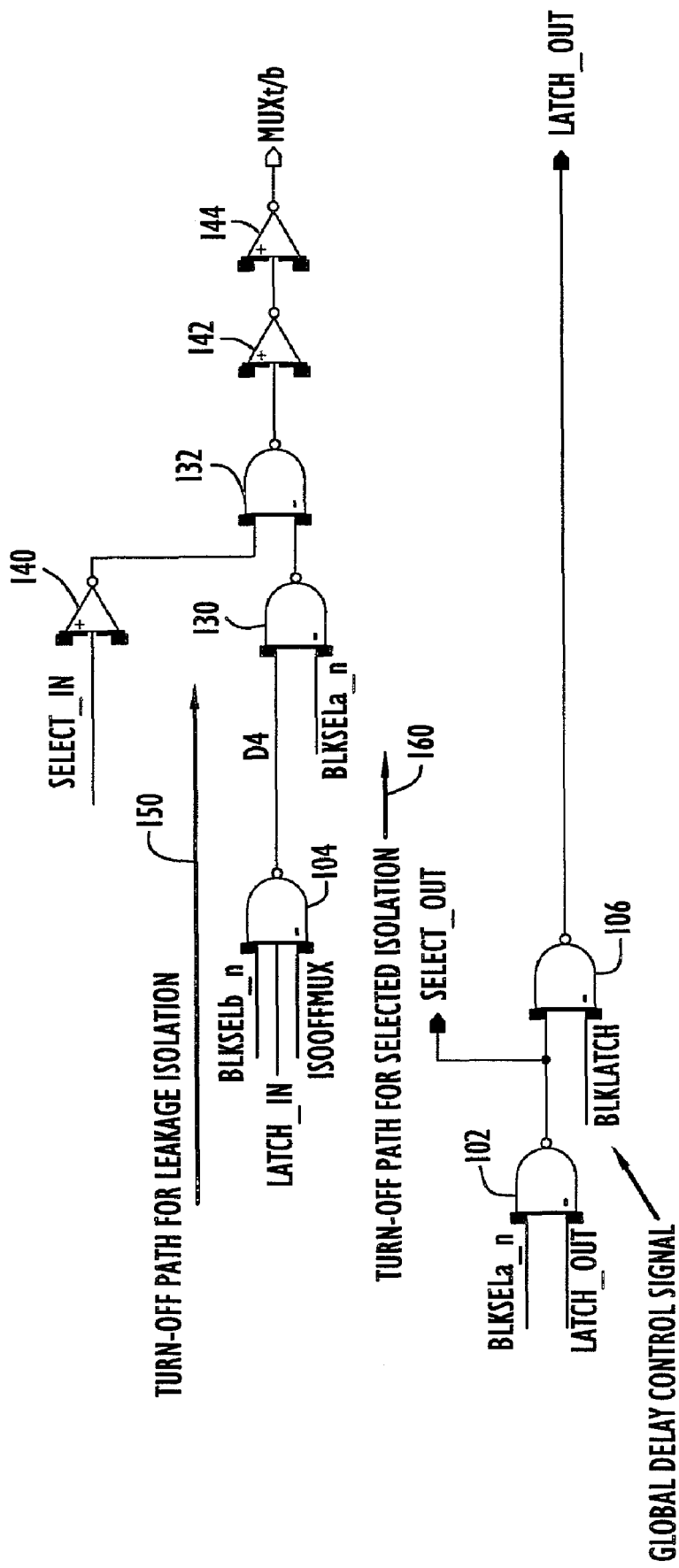
FIG. 8 is a schematic diagram of a multiplexer control circuit forming a portion of the control logic shown in FIG. 5, according to another embodiment of the invention.

FIG. 8 shows a schematic diagram of a multiplexer control circuit 100(t)' (and 100(b)') that is responsive to such a global delay signal according to another embodiment of the invention. Thus, in the first turn-off circuit path 150, rather than have a programmable delay circuit, the cross-coupling of a latching signal between "t" side and "b" side multiplexer control circuits is used to hold the input D1 to NAND gate 130 in the selected state even after the selection signal (blksel_n, blkseII_n) has returned to the unselected state. The assertion of the latching signal is controlled by a global delay signal, blklatch. Thus, when blklatch is asserted, it causes the signal at the latch_out output of that multiplexer control circuit to go high. And, as shown in FIG. 5, the signal at latch_out of one of the multiplexer control circuits in the complementary pair ("t" side and "b" side) of multiplexer circuits is connected to the latch_in input of the other multiplexer control circuit in the complementary pair. Otherwise, the circuit shown in FIG. 8 is the same as the circuit shown in FIG. 6. When the global delay signal blklatch goes high, it causes the latching signal at the latch_in input of both multiplexer control circuits in the complementary pair to force the appropriate state of the input D1 to NAND gate 130 once the process of array selection is started and D1 stays high for a time period sufficient to achieve the delayed turn-off of the multiplexer on the side of the sense amplifier that is to be isolated after being in a selected state.

The global delay control signal blklatch may be generated in another part of the semiconductor memory device (external to and possibly remote from the multiplexer control circuits) where control logic resides for distribution to multiples portions of the memory device. The global delay control signal remains high (after a selected state of a memory array segment) for a period of time that is adjustable to ensure sufficient equalization of the sense nodes of the sense amplifier.

Figure 9:
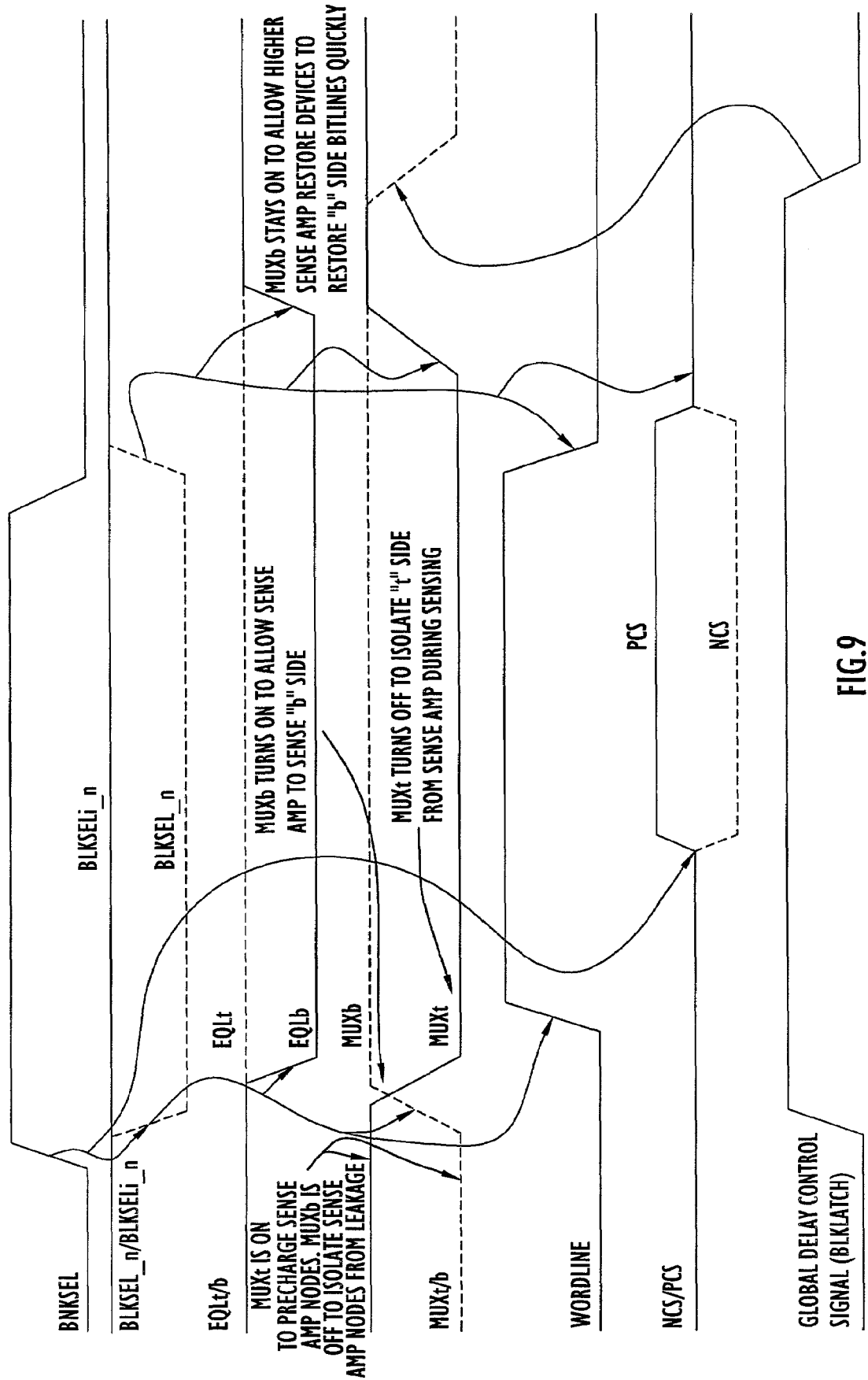
FIG. 9 is a timing diagram showing operation of a sense amplifier circuit configuration employing the multiplexer control circuit shown in FIG. 8 according to one embodiment of the invention.

With reference to FIG. 9, operation of the alternative embodiment of the multiplexer control circuit is described. The operation of the circuit shown in FIG. 8 is similar to the one in FIG. 6 except that the global_delay signal determines the delay period after which isolation occurs. The global_delay signal goes high at the beginning of an access cycle. Thus, as shown in FIG. 9, it goes high when MUXb goes high for an sense cycle on the "b" side while MUXt immediately goes low to isolate on the "t" side. Thus, for the transition of the MUXt signal for isolation in this case, the second turn-off circuit path is used and the status of the global_delay signal has no impact on the control signal to the multiplexer 24 on the "t" side of the sense amplifier. When access to the "b" side is ended, MUXt goes high to precharge the "t" side of the sense amplifier, and the global_delay signal in the first turn-off circuit path keeps MUXb high for a period of time. When the global delay signal ultimately goes low after a period of time sufficient to equalize the sense amplifier nodes, this causes the MUXb signal to go low, switching the multiplexer on the "b" side to the off state to thereby isolate the sense amplifier from the "b" side.

It should be understood that while the terms "on" and "off" are used in the foregoing description with respect to the multiplexer circuits, that more generally the multiplexer circuits may be any switching circuit that is capable of switching between at least first and second states. The first state may be the state in which the switching circuit connects the sense amplifier to the memory array segment on one side of the sense amplifier, and the second state may be the state in which the switching circuit disconnects the sense amplifier from the memory array segment on that side of the sense amplifier. Of course, the states could be reversed.

Furthermore, the delay in isolating the sense amplifier from a memory array segment having a bitline leakage anomaly may be built into the control circuitry on the memory chip if there is sufficient area where this circuit is located to accommodate the extra inverter, etc. as shown in FIG. 6. Alternatively, the delay may originate from a signal that is broadcast (global delay signal) from another part of the memory chip as shown in FIG. 8. This later configuration may be useful when there not sufficient space to generate the delay locally, or when it may be otherwise desirable to institute the delay under control of a global delay control signal.

Figure 10:
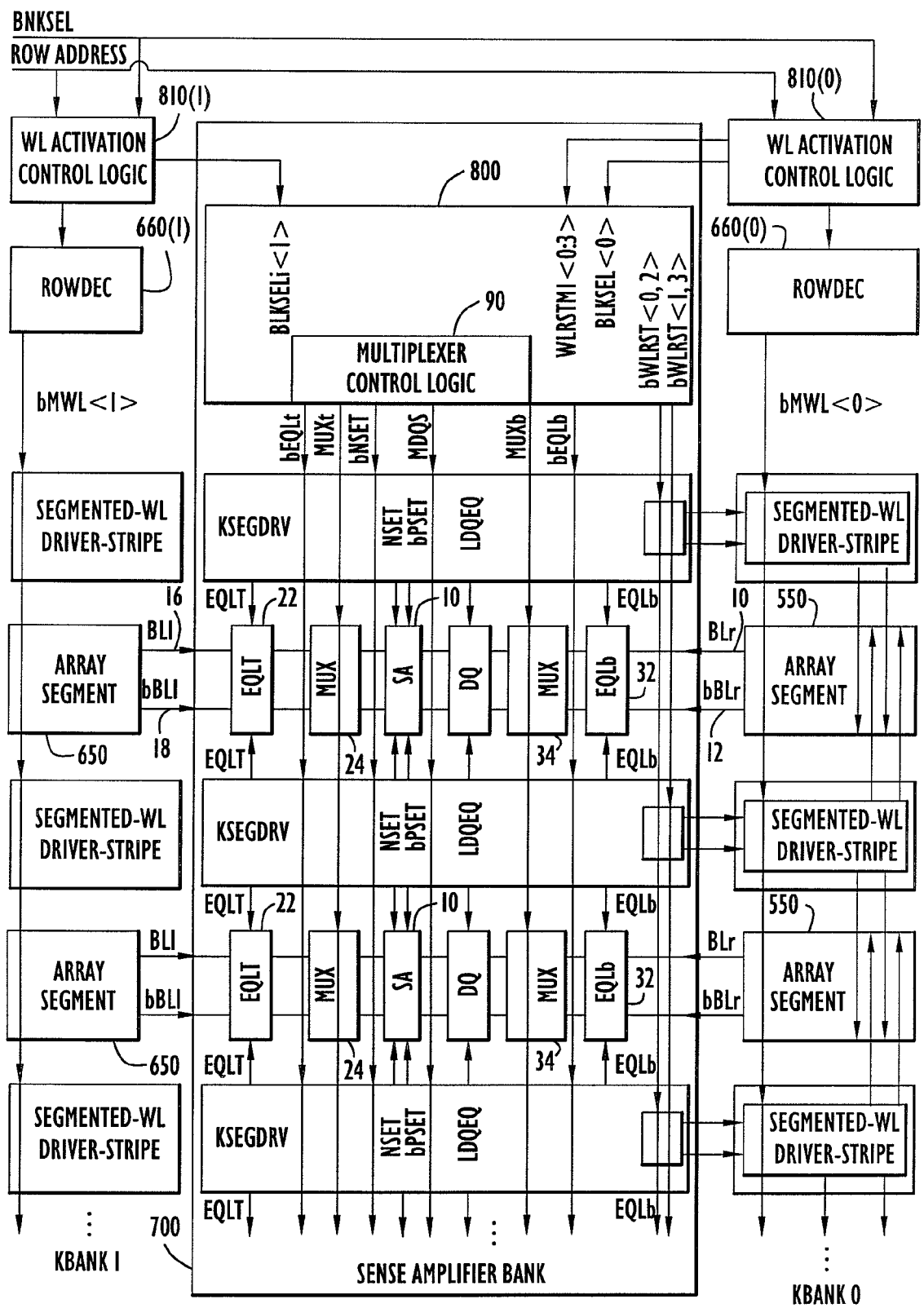
FIG. 10 is a block diagram showing how the multiplexer control logic may be integrated into a DRAM device according to one embodiment.

FIG. 10 illustrates how the multiplexer control logic 90 may be used in a segmented DRAM array having multiple banks, KBank0, KBank1, etc, according to one embodiment. Each bank consisting of a column of memory arrays segments. For example, KBank0 has memory array segments 550 and KBank1 has memory array segments 650. Each memory array segment comprises multiple wordlines (WLs) activated under control of at least one master WL (e.g., bMWL0 for KBank0) and there are memory cells at every other intersection of BL with WL in each memory array segment 550 and 650 as is typical of a folded bitline array architecture.

A DRAM array is typically composed of a multiple of memory array banks, each comprising multiple memory array segments or segments. Each bank comprises its own WL activation control logic block. For example, bank segment KBANK0 comprises multiple memory array segments 550 controlled by WL activation control logic 810(0) and bank segment KBANK1 comprises multiple memory array segments 650 controlled by WL activation control logic 810 (1), etc.

Access to each memory bank is controlled by a corresponding row decoder (RowDec) 660(i). A sense amplifier bank 700 is positioned between memory banks, with sense amplifiers 10 shared by arrays 550 and 650 on "b" and "t" sides, respectively. The multiplexer 24 connects/disconnects the sense amplifier 10 to/from the memory array segments 650 on the "t" side and the multiplexer 34 connects/disconnects the sense amplifier 10 to/from the memory array segments 550 on the "b" side. A sense amplifier control logic section 800 resides in the sense amplifier bank 700 and the multiplexer control logic 90 resides in the sense amplifier control logic section 800 where it produces the MUXt and MUXb control signals described above.

The multiplexer control logic 90 controls the corresponding multiplexer circuits 24 and 34, respectively, such that the isolation control signals control only the unselected multiplexer output state. That is, the block select signals bBLKSEL and bBLKSELi automatically override the isolate control signal state and bring the output of the multiplexer to the proper selected state, regardless of its starting state. In one embodiment, the bBLKSEL and bBLKSELi signals may be generated in WL activation control logic section 810 along a periphery of an array in the memory device. The block select signals are dependent on which memory bank is to be accessed based on incoming address information. In one embodiment, this is where the logic resides that generates the signals that turn on and off a WL and to control the sense amplifiers that are in a column along the edge of array segments.

The intelligence to keep track of which memory array segments have a BL leakage anomaly is contained in manufacturing programs and databases. A BL leakage anomaly is an array related leakage current that may be due to low resistive path defects (e.g., short-circuits), excessive junction leakage, or other causes. The memory device is interrogated by test equipment and the test results are stored in computer system files and processed off-line by various analysis programs. These programs create a database file that is accessed when a wafer arrives at a fuse programming tool. The database file tells the fuse programming tool on which memory devices and which array segments (array segments) on the memory device the isolation feature is to be activated.

A bank select signal BNKSEL and row addresses are presented to the WL activation control logic block 810(i) of each memory bank for use when a particular memory array bank is to be read from or written to. A portion of the row address determines which memory banks are selected and generates BLKSEL signal(s) to activate at least one bank. The remainder of the row address determines which WL with in an array bank is activated.

Each WL activation control logic 810(i) receives a BNK-SEL signal and initiates the process of turning on a WL within each memory segment of the memory bank and accordingly activating the sense amplifier control signals when the corresponding BLKSEL signal transitions to an active state.

When the BNKSEL signal to a WL activation control logic 810(i) transitions to an active state, the control logic 90 responds by turning off the bitline equalization to the array segments of the bank being accessed and by turning off the multiplexer circuits to the associated array segment of the adjacent bank that is not being accessed. The multiplexer circuits connected to the array segments that are accessed are either turned on or maintained on to connect the BLs of each array segment to the associated sense amplifiers of the shared sense amplifier column.

At the same time the sense amplifier control logic is responding to the BLKSEL signal, the WL activation control logic 810(i) decodes the remainder of the row address to select and activate a master wordline (bMWL) and bWLRST signals. The activation of the bMWL and bWLSRST signals will in turn activate a local WL for each memory array segment within the memory bank.

Only one local WL can be activated within each array segment at one time. When this occurs the array cell associated with the WL is connected to a BL of the array segment and its' charge is shared between the capacitance of the BL and the array cell capacitor creating a change in the potential of the connected BL. Because of the arrangement of BL and WL connections in a folded BL architecture, only every other BL is connected by an activated WL to an array cell at a given time. This permits every other BL to serve as a voltage reference to the sense amplifier.

After a sufficient time is allowed for the cell charge to share with the BL capacitance, the control logic 90 generates a bNSET signal which turns on all sense amplifiers 10 in the sense amplifier bank 700. Each sense amplifier 10 then senses a small potential difference between a reference and active BL pair and amplifies the small difference to a binary state. The process of amplification also re-writes the original stored potential back into the array cell after it has been altered by the charge sharing.

When the access to the memory cell is ended, the memory bank and all the array segments within the bank are returned to an unselected state with the dis-assertion of the BNKSEL signal. This causes the turn-off or resetting of all the memory array segments and the sense amplifier control signals in a correct order. First, the bMWL and bMWLRST signals are reset which turns off the WL and disconnects the memory cell from the BL. Next, the sense amplifier signal, bNSET, is reset turning off the sense amplifiers. Finally, the BL equalize signal to the formerly accessed memory array segments is turned back on to reset and restore the BLs while the multiplexer devices are turned on to reconnect the isolated BLs to the sense amplifier. This also allow allows the BL reset and equalization operation to perform the same function on the sense nodes of the sense amplifier. After all this has been completed the memory bank and associated array segments is back to a quiescent unselected state and ready for another memory access.

The system and methods described herein may be embodied in other specific forms without departing from the spirit or essential characteristics thereof. The foregoing embodiments are therefore to be considered in all respects illustrative and not meant to be limiting.

What is claimed is:

1. A circuit configuration for a sense amplifier in a semiconductor memory device, comprising:

a switch circuit connected between the sense amplifier and a memory array segment, wherein the switch circuit connects and disconnects the sense amplifier to and from the memory array segment; and a control circuit that is configured to control the switch circuit to delay disconnecting the sense amplifier from the memory array segment when transitioning from a selected state of the memory array segment to an unselected state of the memory array segment when isolating the sense amplifier from the memory array segment in its unselected state due to a bitline leakage anomaly in the memory array segment, wherein said control circuit is configured to control the switch circuit to change from a first state to a second state in order to disconnect and isolate the sense amplifier from the memory array segment, and wherein said control circuit comprises a first circuit path and a second circuit path either of which controls the switch circuit to change from the first state to the second state, wherein the first circuit path rapidly changes the switch circuit to the second state when transitioning from the unselected state to the selected state of the memory array segment and wherein the second circuit path delays changing the switch circuit to the second state when transitioning from the selected state to the unselected state of the memory array segment.

2. The circuit configuration of claim 1, wherein said control circuit controls the switch circuit to delay disconnecting of the sense amplifier from the memory array segment for a period of time that is adjustable.

3. The circuit configuration of claim 1, wherein said control circuit controls the switch circuit to delay disconnecting of the sense amplifier for a period of time that is long enough to achieve complete equalization of sense nodes of the sense amplifier.

4. The circuit configuration of claim 3, wherein said control circuit controls the switch circuit to delay disconnecting of the sense amplifier for said period of time that is short enough to effectively eliminate leakage current from the memory array segment.

5. The circuit configuration of claim 1, wherein the second circuit path of the control circuit comprises one or more circuit elements that are selectable to introduce delay to a control signal output by said control circuit that causes the switch circuit to change from said first state to said second state.

6. The circuit configuration of claim 1, wherein the second circuit path of the control circuit comprises an input for a delay control signal that is timed to introduce delay to a control signal output by said control circuit that causes the switch circuit to change from said first state to said second state.

7. The circuit configuration of claim 6, wherein the second circuit path receives as input said delay control signal produced by a circuit located external to said control circuit.

8. A semiconductor memory device that employs a sense amplifier to sense charge in a memory array segment, comprising:

switching means for connecting and disconnecting said sense amplifier to and from said memory array segment; and controlling means for controlling the switching means to delay disconnecting of the sense amplifier from the memory array segment when transitioning from a selected state of the memory array segment to an unselected state of the memory array segment when isolating the sense amplifier from the memory array segment in its unselected state due to a bitline leakage anomaly in the memory array segment, wherein said controlling means controls the switching means to switch from a first state to a second state so as to disconnect and isolate the sense amplifier from the memory array segment, and wherein the controlling means comprises a first circuit path and a second circuit path either of which controls the switch circuit to switch from the first state to the second state, wherein the first circuit path rapidly switches the switch circuit to the second state when transitioning from the unselected state to the selected state of the memory array segment, and wherein the second circuit path delays switching the switch circuit to the second state when transitioning from the selected state to the unselected state of the memory array segment.

9. The semiconductor memory device of claim 8, wherein said controlling means is controllable to adjust the amount of delay introduced to the control signal.

10. The semiconductor memory device of claim 8, wherein said controlling means controls the amount of delay so that it is long enough to achieve complete equalization of sense nodes of the sense amplifier but short enough to effectively eliminate leakage current from the memory array segment.

11. A sense amplifier circuit configuration in a semiconductor memory device, comprising:
   a. a sense amplifier having sense nodes;
   b. a first memory array and a second memory array segment;
   c. a first switch circuit connected between the sense amplifier and the first memory array segment, wherein in response to a first control signal the first switch circuit connects the sense nodes of the sense amplifier to, or disconnects the sense nodes of the sense amplifier from, the first memory array segment;
   d. a second switch circuit connected between the sense amplifier and the second memory array segment, wherein in response to a second control signal the second switch circuit connects the sense nodes of the sense amplifier to, or disconnects the sense nodes of the sense amplifier from, the second memory array segment;
   e. a control block that generates the first and second control signals so that the first switch circuits delays disconnection of the sense amplifier from the first memory array segment when transitioning from a selected state of the first memory array segment to an unselected state of the first memory array segment when isolating the sense amplifier from the first memory array segment in its unselected state due to a bitline leakage anomaly in the first memory array segment, and so that the second switch circuits delays disconnection of the sense amplifier from the second memory away segment when transitioning from a selected state of the second memory array segment to an unselected state of the second memory array segment when isolating the sense amplifier from the second memory array in its unselected state due to a bitline leakage anomaly in the second memory array segment.

12. The sense amplifier circuit configuration of claim 11, wherein the control block generates the first and second control signals to delay disconnecting of the sense amplifier from the corresponding first and second memory array segments for a period of time that is adjustable.

13. The sense amplifier circuit configuration of claim 11, wherein the control block comprises first and second control circuits, wherein the first control circuit generates the first control signal for the first switch circuit and the second control circuit generates the second control signal for the second switch circuit.

14. The sense amplifier circuit configuration of claim 13, wherein the first and second control circuits are structurally identical, and wherein the first control circuit produces at least one output signal that is coupled as an input to the second control circuit and the second control circuit produces at least one output signal that is coupled as an input to the first control circuit.

15. The sense amplifier circuit configuration of claim 11, wherein the control block controls the first and second switch circuits so as to delay disconnecting of the sense amplifier from the first and second memory array segments, respectively, for a period of time that is long enough to achieve complete equalization of sense nodes of the sense amplifier and short enough to effectively eliminate leakage current from the first memory array segment or second memory array segment, respectively.

* * * * *